(12) United States Patent
Smith

(10) Patent No.: US 11,588,320 B2
(45) Date of Patent: Feb. 21, 2023

(54) POWER DISTRIBUTION ASSEMBLY HAVING A FAULT DETECTION SYSTEM

(71) Applicant: GE Aviation Systems Limited, Cheltenham (GB)

(72) Inventor: Michael James Smith, Chadlington (GB)

(73) Assignee: GE Aviation Systems Limited, Cheltenham (GB)

(*) Notice: Subject to any disclaimer, the term of this patent is extended or adjusted under 35 U.S.C. 154(b) by 84 days.

(21) Appl. No.: 16/925,401

(22) Filed: Jul. 10, 2020

(65) Prior Publication Data

US 2022/0014011 A1 Jan. 13, 2022

(51) Int. Cl.
*H02H 5/00* (2006.01)
*H02H 1/00* (2006.01)

(52) U.S. Cl.
CPC ............ *H02H 5/00* (2013.01); *H02H 1/0007* (2013.01); *B64D 2221/00* (2013.01)

(58) Field of Classification Search
CPC ..... H02H 5/00; H02H 1/0007; B64D 2221/00
See application file for complete search history.

(56) References Cited

U.S. PATENT DOCUMENTS

| | | | |
|---|---|---|---|
| 4,499,446 A | 2/1985 | Swanson | |
| 5,761,017 A | 6/1998 | Hodge et al. | |
| 5,867,356 A | 2/1999 | Duggal et al. | |
| 6,157,286 A | 12/2000 | Ranjan et al. | |
| 9,510,439 B2 | 11/2016 | Martin et al. | |
| 2004/0190269 A1 | 9/2004 | Makaran | |
| 2011/0117393 A1* | 5/2011 | Borel | H01H 37/76 429/7 |
| 2013/0040820 A1 | 2/2013 | Selvamanickam et al. | |
| 2016/0042896 A1* | 2/2016 | Kingston | H02B 1/565 218/157 |
| 2017/0365826 A1* | 12/2017 | Varipatis | H01M 50/183 |
| 2019/0287750 A1* | 9/2019 | Ren | H02B 13/045 |
| 2020/0017235 A1* | 1/2020 | Compton | G05B 19/0428 |

* cited by examiner

*Primary Examiner* — Scott Bauer
(74) *Attorney, Agent, or Firm* — McGarry Bair PC

(57) ABSTRACT

A power distribution assembly comprising a chassis having at least one wall, a deformable material layer positioned on the at least one wall of the chassis and configured to deform in response to a triggering even. The power distribution assembly further comprising a conductive sense layer positioned on the deformable material layer opposite the at least one wall of the chassis.

20 Claims, 5 Drawing Sheets

POWER DISTRIBUTION ASSEMBLY HAVING A FAULT DETECTION SYSTEM

TECHNICAL FIELD

This disclosure generally relates to a power distribution assembly with a fault detection system and more specifically to an electrical fault detection system.

BACKGROUND

Electrical systems, such as those found in a power distribution assembly, employ electrical bus bars and a larger amount of wiring for delivering power from electrical power sources to electrical loads. In the event of an electrical arc fault or other failure condition, high currents might be transmitted through a normally nonconductive medium, such as air, with unexpected consequences for the power distribution assembly at or about the arcing failure point.

BRIEF DESCRIPTION

In one aspect, the present disclosure relates to a power distribution assembly, comprising a chassis having at least one wall, a deformable material layer positioned on the at least one wall of the chassis, the deformable material layer configured to deform in response to a triggering event, and a conductive sense layer positioned on the deformable material layer, opposite the at least one wall of the chassis, wherein the sense layer breaks conductivity in response to the deformation of the deformable material layer.

In another aspect, the present disclosure relates to a power distribution assembly, comprising a printed circuit board, a chassis enclosing the printed circuit board, the chasing having at least one wall, a deformable material layer positioned on the at least one wall of the chassis, the deformable material layer configured to deform in response to a triggering event, a conductive sense layer positioned on the deformable material layer, opposite the at least one wall of the chassis, wherein the sense layer breaks conductivity in response to the deformation of the deformable material layer, and a fault detection circuit configured to detect when the sense layer breaks conductivity in response to the deformation of the deformable material layer.

In another aspect, the present disclosure relates to a method of detecting an electrical fault at a printed circuit board in a chassis, the method, comprising monitoring, by a fault detection circuit, a conductive state of a sense layer overlying a deformable material layer, the deformable material layer further overlying at least a portion of at least one wall of the chassis, and whereby the deformable material layer is configured to deform in response to an electrical fault, and in response to a change in the conductive state of the sense layer, controllably operating the printed circuit board, by the fault detection circuit.

BRIEF DESCRIPTION OF THE DRAWINGS

A full and enabling disclosure of the present description, including the best mode thereof, directed to one of ordinary skill in the art, is set forth in the specification, which refers to the appended FIGS., in which.

DETAILED DESCRIPTION

Figure 1:
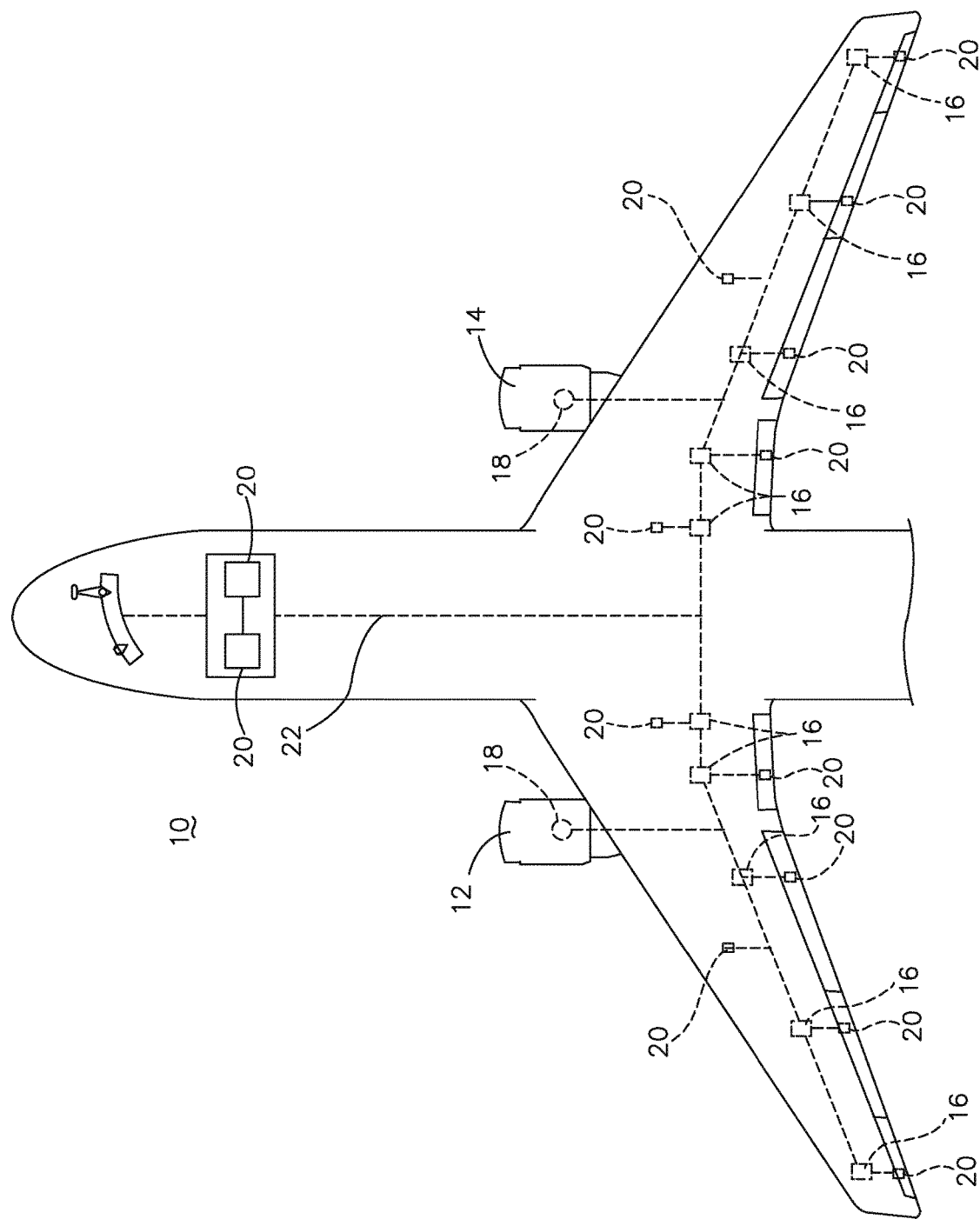
FIG. 1 is a schematic top view of an aircraft including a power distribution assembly according to various aspects described herein.

Aspects of the disclosure described herein are provided with respect to a fault detection system for a power distribution assembly that can be used, by way of non-limiting example, in an aircraft. While this description is primarily directed toward a power distribution assembly for an aircraft, it is also applicable to any environment using an electrical system for transmitting power from a power source to an electrical load. It will be understood that while one aspect is shown in an aircraft environment, the disclosure is not so limited and has general application to electrical power systems in non-aircraft applications, such as other mobile applications and non-mobile industrial, commercial, and residential applications.

Fault detection systems, specifically fault detection circuits, can be configured to monitor the status of a set of power distribution assemblies. When a fault (e.g., an increased heat or current) is detected, the fault detection system can shut off operation of the power distribution assembly. In conventional fault detection systems, the fault detection circuit can monitor the status of the power distribution assembly through a layer of material configured to melt when a fault occurs. These conventional fault detections systems can require additional components, such as a thin trace element, in order to reduce the melt time of the layer of material. As the thing trace elements can be required in conventional fault detection systems this, in turn, can increase the costs associated with conventional fault detection systems and limit the materials that can be used. Additionally, conventional fault detection systems can be configured to detect only one fault condition. As a result, multiple fault detection systems or layers of material can be required within a single power distribution assembly.

While "a set of" various elements will be described, it will be understood that "a set" can include any number of the respective elements, including only one element. Also, as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor, and the controller module or processor can perform processing on the value to determine a representative value or an electrical characteristic representative of said value.

Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured, connected, or connectable to provide, enable, disable, or the like, an electrical connection between respective elements. Non-limiting example power distribution bus connections or disconnections can be enabled or operated by way of switching, bus tie logic, or any other connectors configured to enable or disable the energizing of electrical loads downstream of the bus.

As used herein, a "system" or a "controller module" can include at least one processor and memory. Non-limiting examples of the memory can include Random Access Memory (RAM), Read-Only Memory (ROM), flash memory, or one or more different types of portable electronic memory, such as discs, DVDs, CD-ROMs, etc., or any suitable combination of these types of memory. The processor can be configured to run any suitable programs or executable instructions designed to carry out various methods, functionality, processing tasks, calculations, or the like, to enable or achieve the technical operations or operations described herein. The program can include a computer program product that can include machine-readable media for carrying or having machine-executable instructions or data structures stored thereon. Such machine-readable media can be any available media, which can be accessed by a general purpose or special purpose computer or other machine with a processor. Generally, such a computer program can include routines, programs, objects, components, data structures, algorithms, etc., that have the technical effect of performing particular tasks or implement particular abstract data types.

As used herein, a controllable switching element, or a "switch" is an electrical device that can be controllable to toggle between a first mode of operation, wherein the switch is "closed" intending to transmit current from a switch input to a switch output, and a second mode of operation, wherein the switch is "open" intending to prevent current from transmitting between the switch input and switch output. In non-limiting examples, connections or disconnections, such as connections enabled or disabled by the controllable switching element, can be selectively configured to provide, enable, disable, or the like, an electrical connection between respective elements.

Non-limiting aspects of the disclosure can be implemented in any electrical circuit environment. A non-limiting example of an electrical circuit environment that can include aspects of the disclosure can include an aircraft power system architecture, which enables production of electrical power from at least one spool of a turbine engine (e.g., a gas turbine engine), and delivers the electrical power to a set of electrical loads via at least one switch. In one example the switch can be in the form of a solid state switch, such as a solid state power controller (SSPC) switching device. One non-limiting example of the SSPC can include a silicon (Si), silicon carbide (SiC) or Gallium Nitride (GaN) based, high power switch. SiC or GaN can be selected based on their solid state material construction, their ability to handle high voltages and large power levels in smaller and lighter form factors, and their high speed switching ability to perform electrical operations very quickly. Additional switching devices or additional silicon-based power switches can also be utilized.

As used herein, an "arc", "arcing," "electrical arc," "arcing event," or "arc fault" will refer to an unintended or undesired conduction of electric current across a traditionally non-conductive medium, such as air. For example, in non-limiting instances, a "parallel arc" can include an arcing event at least partially connecting two points which are intended to be insulated from each other. In another non-limiting instance, a "series arc" can include an arcing event in which a conductive medium becomes non-conductive or poorly conductive between two parts of an intended conductive path. Furthermore, an arcing event can include an unexpected power loss regardless of whether there is an obvious arc manifestation (e.g. a visible or visually identifiable occurrence). In another non-limiting instance, a series arc can include an unexpected impedance. While "arc faults" and "electrical arcs" are described herein for understanding, aspects of the disclosure are applicable to any electrical faults, including leakage current faults, dielectric breakdowns, arc faults, or the like.

As used herein, the term "satisfies" with respect to a threshold value means that a respective value is equal to or greater than the threshold value, or being within a threshold value range (e.g. within tolerance). It will be understood that such a determination may easily be altered to be satisfied by a positive/negative comparison or a true/false comparison. In one aspect of the disclosure, satisfying a threshold of the aforementioned power characteristics can include falling within a threshold value range, such as between 3.9 V and 4.1 V by way of non-limiting example. Additional thresholds and threshold ranges can be included.

Electrical failures, including electrical arcs, might occur in an environment where, for example, physical defects in an electrical connection cause a permanent or temporary loss in transmission capabilities. Where a physical separation occurs, the voltage difference between each of the separated terminals in addition to a short distance of separation, can allow for an electrical arc to strike between the terminals. In an environment with vibrations, for instance, as in a moving aircraft, a physical defect in an electrical connection might result in intermittent arcing events as the vibrations disconnect and reconnect the electrical connection at the point of the physical defect. In yet another example, an electrical arc might be caused by or relate to a loose terminal connection or a drawn series fault.

The exemplary drawings are for purposes of illustration only and the dimensions, positions, order and relative sizes reflected in the drawings attached hereto can vary.

As illustrated in FIG. 1, an aircraft 10 can include a power system such as at least one gas turbine engine, shown as a left engine system 12 and a right engine system 14. Alternatively, the power system can have fewer or additional engine systems. The left and right engine systems 12, 14 can be identical, and can further include at least one power source such as an electric machine. Specifically, the electric machine can be a generator 18. Further, the aircraft 10 is shown as having a set of power-consuming components, or electrical loads 20, such as for instance, an actuator load, flight critical loads, and non-flight critical loads. The electrical loads 20 are electrically coupled with at least one of the generators 18 via a power distribution assembly including, for instance, transmission lines 22 or bus bars, and power distribution nodes 16. It will be understood that the illustrated aspect of FIG. 1 is only one non-limiting example of a power distribution assembly, and many other possible aspects and configurations in addition to that shown are contemplated by the present disclosure. Furthermore, the number of, and placement of, the various components depicted in FIG. 1 are also non-limiting examples of aspects associated with the disclosure.

In the aircraft 10 the operation of the left and right engine systems 12, 14 provide mechanical energy which can be extracted, typically via a spool, to provide a driving force for the generator 18. The generator 18, in turn, generates power, such as alternating current (AC) or direct current (DC) power, and provides the generated power to the transmission lines 22, which deliver the power to the power distribution nodes 16, positioned throughout the aircraft 10. The power distribution nodes 16 receive the AC or DC power via the transmission lines 22, and can provide switching, power conversion, or distribution management functions, as needed, in order to provide the desired electrical power to the electrical loads 20 for load operations.

Example power distribution management functions can include, but are not limited to, selectively enabling or disabling the delivery of power to corresponding electrical loads 20, depending on, for example, available power distribution supply, criticality of electrical load 20 functionality, or aircraft mode of operation, such as take-off, cruise, or ground operations. Additional power distribution management functions can be included. Furthermore, additional power sources for providing power to the electrical loads 20, such as emergency power sources, ram air turbine systems, starter/generators, batteries, or the like can be included, and substitute for or supplement the power source.

Figure 2:
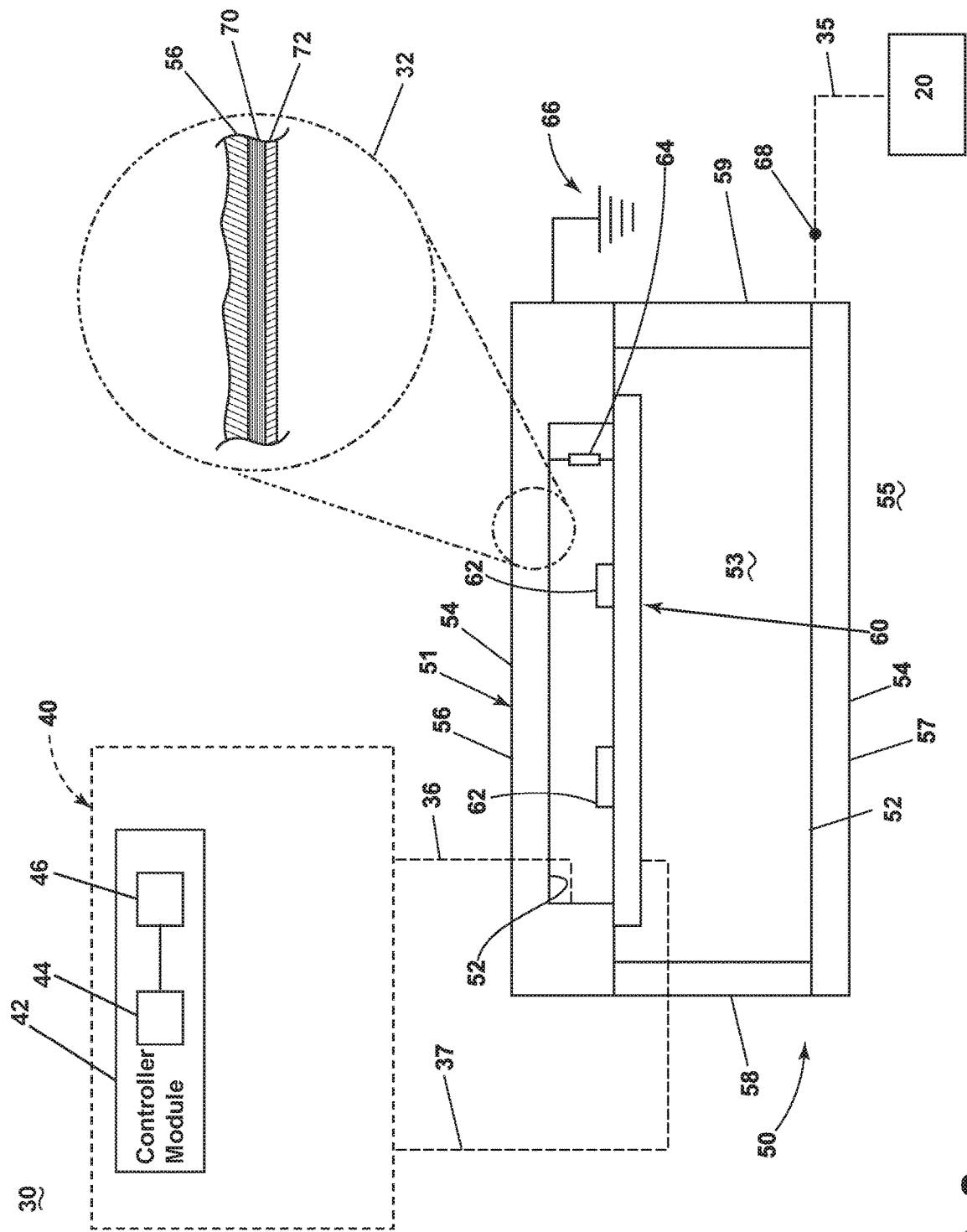
FIG. 2 is a schematic view of the power distribution assembly that can be utilized in the aircraft of FIG. 1.

FIG. 2 illustrates a portion of the power distribution assembly of FIG. 1 in further detail including a fault detection system 30, a fault detection circuit 40, and a power distribution unit (PDU) 50. The PDU 50 can include a chassis 51 including any suitable material for the environment. Non-limiting examples of the chassis 51 can include, but are not limited to, aluminum, steel, graphite, or a composite material. The chassis 51 can have an inner surface 52 defining an interior 53 and an outer surface 54 defining an exterior 55. In the illustrated example, the chassis 51 includes a top wall 56, a bottom wall 57, and a set of opposing sidewalls 58, 59. While not shown in FIG. 2, the chassis 51 can also include front and back walls such that the interior 53 can be partially or completely enclosed. Further, any of the walls 56, 57, 58, 59 can be removable to selectively provide access to the interior 53.

At least one power distribution component, illustrated as a printed circuit board (PCB) 60, can be housed within the interior 53 of the chassis 51, such as via a set of rails or mounting hardware as appropriate. It will be appreciated that as used herein, the PCB 60 can be further referred to as a "circuit board." In an alternate example, another power distribution component having a contactor and discrete wiring can be used in place of, or in combination with, the PCB 60. In a non-limiting example, the PCB 60 can be included in a power switching device or another power supply within the chassis 51. In addition, the PCB 60 can include circuit elements shown as solid-state switching components 62 that operate to selectively supply power to the downstream electrical load(s) 20, shown schematically as a single electrical load 20.

An electrically resistive or high-impedance component, illustrated as a resistor 64, can be electrically coupled between a powered portion of the PCB 60 and the chassis 51. As used herein, the powered portion of the PCB 60 can be defined as any portion of the PCB 60 which directly receives a power input (e.g., from an AC or DC power supply). For example, the PDU 50 can supply AC power to the resistor 64, hence, the resistor 64 would be considered to be included within the powered portion of the PCB 60. In the prior example where the PDU 50 supplies AC power, any suitable component having sufficient impedance can be utilized in place of the resistor 64. In the example shown, the resistor 64 can be coupled to the inner surface 52 of the chassis 51.

The outer surface 54 of the chassis 51 can be electrically connected to an electrical ground 66. Non-limiting aspects of the electrical ground 66 can include a common electrical grounding, an earth ground, or a common frame such as the aircraft frame. In addition, an exemplary power output 68 of the PDU 50 is illustrated where the PDU 50 connects to the electrical load 20 via a conductor 35. It will be understood that the exemplary power output 68 can represent one or multiple power outputs from the PDU 50. For example, the PDU 50 can include a plurality of power outputs electrically connected to a set of electrical loads 20, and the exemplary power output 68 as shown can represent the summated power provided to the set of electrical loads 20. In another example, the exemplary power output 68 can represent a power output to each electrical load 20 in a set of multiple electrical loads 20 connected to the PDU 50.

The fault detection circuit 40 can be supplied with power from the generator 18 (FIG. 1) and electrically coupled to the PDU 50 by way of respective first and second conductors 36, 37. The first conductor 36 can be electrically coupled to the inner surface 52 of the chassis 51, and the second conductor 37 can be electrically coupled to the PCB 60 to supply power to the PCB 60. The exemplary fault detection circuit 40 can include various internal components such as, but not limited to, resistors, voltage sensors, grounds, and switching elements. The fault detection circuit 40 can further include a controller module 42 with a corresponding memory 44 and processor 46. The memory 44 can be defined as an internal storage for various aspects of the fault detection circuit 40. For example, the memory 44 can store code, executable instructions, commands, instructions, authorization keys, specialized data keys, passwords, or the like. The memory 44 can be RAM, ROM, flash memory, or one or more different types of portable electronic memory, such as discs, DVDs, CD-ROMs, etc., or any suitable combination of these types of memory. The processor 46 can be defined as a portion of the controller module 42 which can receive an input, perform calculations, and output executable data. The processor 46 can be a microprocessor.

The controller module 42 can be configured or adapted to execute controllable operations, for instance, in response to received signals, data, or the like, and generate control commands, signals, or another enabling or operative functional output. The controller module 42 can be further configured to monitor and report on the status of the various components within the chassis 51. For example, the controller module 42 can monitor various conditions of the PCB 60 such as, but not limited to, the power supplied to the PCB 60, the status oft the PCB 60, or the occurrence of a fault within the PCB 60.

FIG. 2 further illustrates an enlarged view 32 of an exemplary section of the chassis 51. It is contemplated, in a non-limiting example, that at least one wall of the chassis 51, such as the top wall 56, can include a deformable material layer 70, and a sense layer 72. Although described in terms of the top wall 56, it will be appreciated that the deformable material layer 70 and the sense layer 72 can be included in or otherwise coupled to any wall 56, 57, 58, 59 of the chassis 51. It will be further appreciated that the deformable material layer 70 and the sense layer 72 can be one of a set of deformable material layers 70 and one of a set of sense layers 72, respectively. As such, there can be any number of deformable material layers 70 and sense layers 72 included within any number of the walls 56, 57, 58, 59.

The deformable material layer 70 can be formed of any suitable materials adapted to deform when a predetermined condition is satisfied. Specifically, the deformable material layer 70 can be configured to volumetrically deform. As used herein the term "volumetric deformation" or "volumetrically deform" can refer to the expansion or contraction of at least a portion of the deformable material layer 70. The deformable material layer 70 is adapted to deform in response to a triggering event within the PDU 50. The deformation of the deformable material layer 70 can extend either outward from or along the top wall 56. It is further contemplated that the deformation can occur at one or more locations of the deformable material layer 70. As used herein, the term triggering event can refer to any event described herein which can cause the deformable material layer 70 to deform. Non-limiting examples of the triggering event can include, but are not limited to, arcing events, or other events that create excess amounts of heat or current. It will further be understood that the deformable material layer 70 could have insulative properties.

The sense layer 72 can be formed of an electrically conductive material. The sense layer 72 is electrically connected to the first conductor 36. The deformable material layer 70 can be positioned between the top wall 56 and the sense layer 72. In one example the sense layer 72 can be formed by additive manufacturing processes such as electrodeposition over the deformable material layer 70. In another example the sense layer 72 can be manufactured or formed prior to coupling with the deformable material layer 70, such as by way of attachment hardware. The deformable material layer 70 and the sense layer 72 can bet attached to the top wall 56 in any suitable manner. Non-limiting examples include, but are not limited to, welding, adhesion (e.g., glue, tape, epoxy, etc.), fastening, or any combination thereof.

It is contemplated that any or all of the walls 56, 57, 58, 59 can include the layered composition illustrated in the enlarged view 32. In another non-limiting example, only walls openly exposed to power components, such as the solid-state switching components 62, or only walls likely to be struck with arcing events, can include the layered composition of the enlarged view 32. In another non-limiting example, all inner surfaces 52 within the chassis 51 can be coupled to deformable material layer 70 and the sense layer 72.

In operation, power supplied by the generator 18 can be utilized for the function of the PCB 60. The resistor 64 coupled to the PCB 60 can bias the sense layer 72 to a non-zero voltage while the top wall 56, or any other wall 57, 58, 59 is grounded via the electrical ground 66. Put another way, the resistor 64 can act as one part of a voltage divider that is completed by the external fault detection circuit 40.

Figure 3:
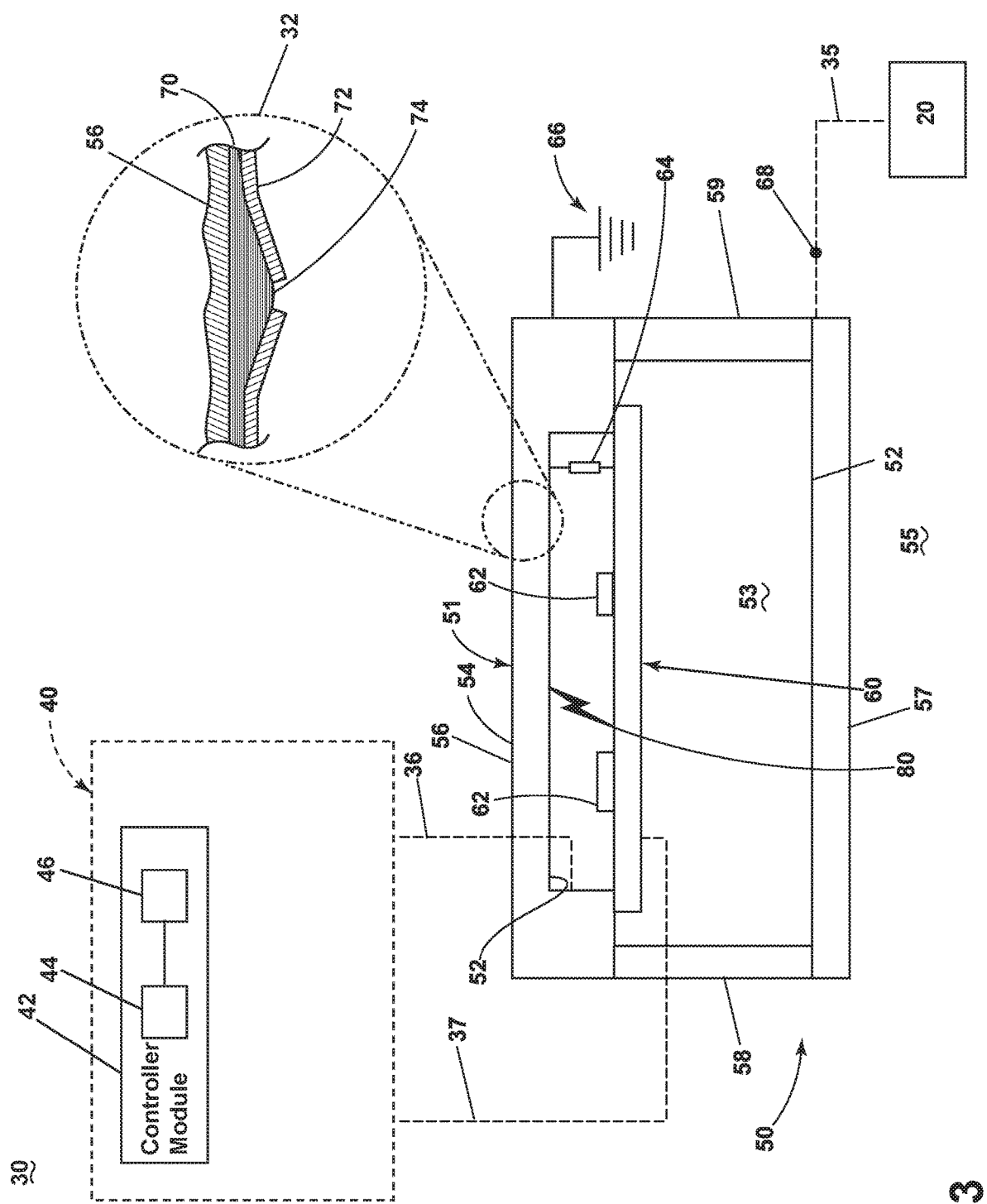
FIG. 3 is a schematic view of the fault detection system of FIG. 2 further illustrating a deformation.

FIG. 3 illustrates a triggering event as a representative arc fault occurring in a segment of the PDU 50. The representative arc fault is shown as a parallel arc fault 80, which can occur when unwanted or undesirable electric current travels between the PCB 60 and the chassis 51. The specific position of the parallel arc fault 80 illustrated is merely one non-limiting example of a schematic arcing event. Aspects of the disclosure can be included wherein arc faults anywhere on a conductive connection can be detected, identified, and the like, in accordance herein, and the actual position of the arc fault.

In the illustrated example, the parallel arc fault 80 is established between the PCB 60 and the sense layer 72 located on the top wall 56 of the chassis 51. In such a case, the deformable material layer 70 can deform away from the top wall 56. Specifically, at least a portion of the deformable material layer 70 can volumetrically deform away from the top wall 56 of the chassis 51. As such, the sense layer 72 will follow the deformation of the deformable material layer 70. The sense layer 72, however, can be configured to break conductivity in response to the deformation of the deformable material layer 70. The conductivity can be broken via a break 74 or a breakpoint in the sense layer 72. The break 74 of the sense layer 72 can be defined as a portion of the sense layer 72 which became discontinuous due to the deformation of the deformable material layer. It is contemplated that the break 74 can be a discontinuity of the sense layer 72 defined by a physical break, snap, or melting of the sense layer 72. In any case, the conductivity is broken.

The fault detection circuit 40 can be configured to detect the break in the conductivity of the sense layer 72. If a break is detected, the fault detection circuit 40, specifically the controller module 42, can notify one or more of a flight crew or a pilot of the aircraft 10 concerning the detection of the break in the conductivity of the sense layer, and hence the presence of the triggering event (e.g., parallel arc fault 80). Additionally, or alternatively, the fault detection circuit 40, specifically the controller module 42, can be configured to shut off operation of the PDU 50 in response to a detected fault. The controller module 42 can be configured to turn on or activate one or more identical back-up PDU's which can be run in place if a fault is detected and the PDU 50 is shut off. The sense layer 72 can break once a threshold deformation of the deformable material layer 70 is reached. More specifically, a threshold heat or threshold current causes the deformable material layer 70 to deform. Once a threshold volumetric deformation of the deformable material layer 70 is reached or surpassed, the sense layer 72 can break (the discontinuity is formed) and the conductivity of the sense layer is broken. As used herein, the term threshold can be defined as a predetermined amount of heat or current, which would indicate a fault or the occurrence of one or more triggering events of the PCB 60.

Figure 4A:
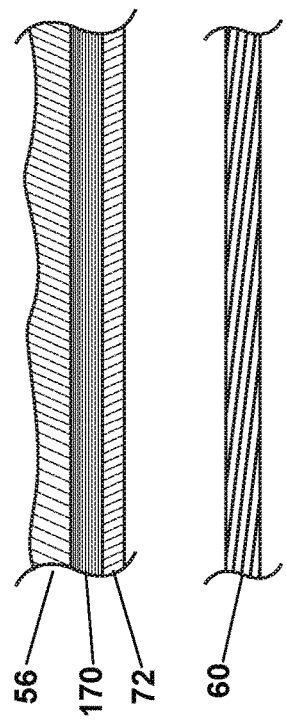
FIG. 4A is a schematic cross-sectional view of an example fault detection system of FIG. 2 according to various aspects described herein.
Figure 4B:
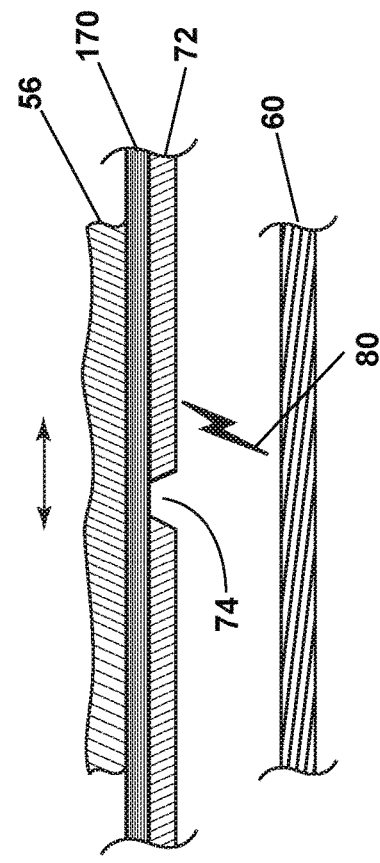
FIG. 4B is a schematic cross-sectional view of the fault detection system of FIG. 4A further illustrating an exemplary deformation.

FIGS. 4A-4B illustrates a non-limiting example fault detection system 130. The fault detection system 130 is similar to the fault detection system 30; therefore, like parts will be identified with like numerals in the 100 series, with it being understood that the description of the like parts of the fault detection system 30 applies to the fault detection system 130 unless otherwise noted.

By way of non-limiting example, FIG. 4A illustrates a fault detection system 130 in the instance where no triggering event, such as the parallel arc of FIG. 3, has occurred. The fault detection system 130 includes a deformable material layer 170 and a sense layer 172 included on the top wall 56 of the chassis 51.

FIG. 4B illustrates the fault detection system 130 in the instance where the triggering event, such as parallel arc fault 80, has occurred. In reaction to the parallel arc fault 80, the deformable material layer 170 can deform along the top wall 56 in the direction indicated by the arrows. Specifically, the deformable material layer 170 can deform along the top wall 56. As such, the sense layer 72 can extend in the same direction as the deformable material layer 170 until break 74 is formed. The break 74 can ultimately break the conductivity of the sense layer 72 and the fault detection system 130, specifically the fault detection circuit 40, can recognize that the fault or triggering event has occurred and responds accordingly.

Figure 5A:
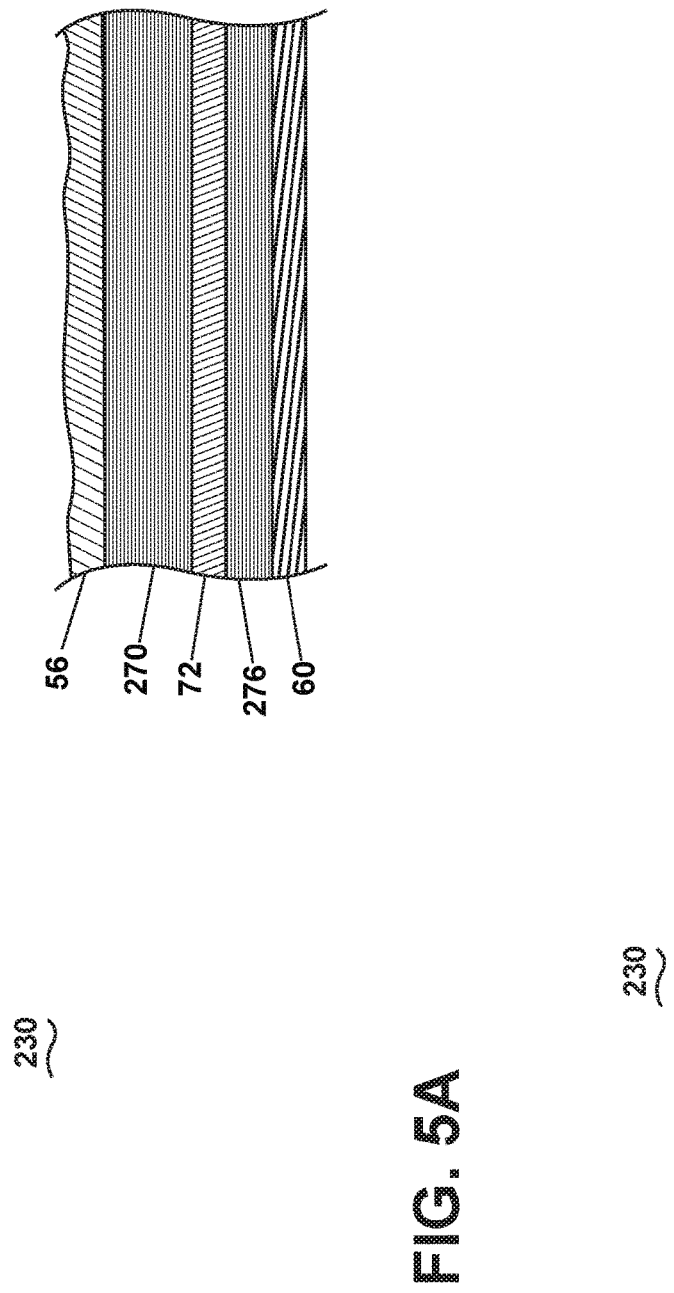
FIG. 5A is a schematic cross-sectional view of another example fault detection system of FIG. 2 according to various aspects described herein.
Figure 5B:
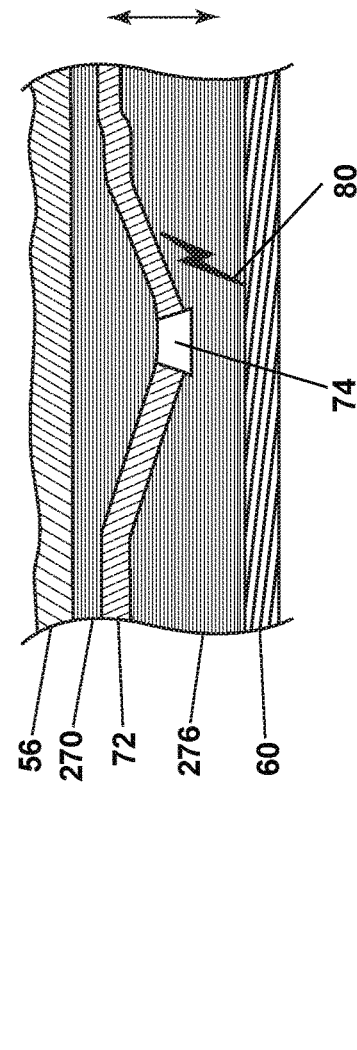
FIG. 5B is a schematic cross-sectional view of the fault detection system of FIG. 5A further illustrating an exemplary deformation.

FIGS. 5A-5B illustrates a non-limiting example fault detection system 230. The fault detection system 230 is similar to the fault detection system 30, 130; therefore, like parts will be identified with like numerals in the 200 series, with it being understood that the description of the like parts of the fault detection system 30, 130 applies to the fault detection system 230 unless otherwise noted.

By way of non-limiting example, FIG. 5A illustrates that a fault detection system 230 including a first deformable material layer 270, a second deformable material layer 276, and the sense layer 72 coupled to the top wall 56 of the chassis 51. As illustrated, the first and second deformable material layers 270, 276 can sandwich the sense layer 72. In other words, the first deformable material layer 270 can be on a first side of the sense layer 70, and the second deformable material layer 276 can be on a second side opposite the first side of the sense layer 70. The first and second deformable material layers 270, 276 can be configured to deform in response to the triggering event created by the PCB 60. Specifically, the first and second deformable material layers 270, 276 can be configured to volumetrically deform in response to the triggering event.

By way of non-limiting example, FIG. 5B illustrates the deformation of the first and second deformable material layers 270, 276 of the fault detection system 230 in response to the triggering event, specifically the parallel arc fault 80. The first deformable material layer 270 can deform away from the top wall 56, while the second deformable material layer 276 can deform toward the top wall 56 or away from the PCB 60. In both instances, the first and second deformable material layers 270, 276 can deform in the direction of the arrow as illustrated.

In response to the deformation of the either one or more of the first or second deformable material layers 270, the sense layer 72 can break conductivity at break 76. As such, the fault detection system 230, specifically the fault detection circuit 40 can recognize that the fault or triggering event has occurred and responds accordingly. It is further contemplated that the first deformable material layer 270 and the second deformable material layer 276 can be configured to deform in response to different triggering events. For example, the first deformable material layer 270 can be configured to deform in response to an excess current, while the second deformable material layer 276 can be configured to deform in response to an excess heat.

It is contemplated that the first deformable material layer 270 includes a first thermal expansion coefficient (TEC), the second deformable material layer 276 includes a second TEC, and the sense layer 72 includes a third TEC. The first, second, and third TECs can be different from one another. Specifically, the third TEC can be smaller than the first and the second TECs. This can be to ensure that the break 74 occurs when either at least the first or the second deformable material layers 270, 276 deform. The first and the second TECs can be equal. Alternatively, they can be non-equal.

Additionally, or alternatively the second deformable material layer 276 can include a potting material layer that is not configured to deform in response to a triggering event created by the PCB 60. The potting material layer can include any suitable non-electrically conductive thermally conductive potting material. The potting material layer can be used to hold or secure various portions of the fault detection system 230 such as, but not limited to, the PCB 60. The potting material layer can limit the possibility of triggering events to occur in the first place. For example, the inclusion of the potting material layer can reduce the conductivity of the portion between the PCB 60 and the top wall 56. As such, the possibility of the formation of the triggering event, such as arcing, can be reduced. The potting material layer can be included between the sense layer 72 and the PCB 60 of any of the PCB 60, 160, 260 as described herein.

Benefits of the present disclosure include a reduction in the complexity of the manufacturing of the fault detection system in comparison with conventional fault detection systems. For example, conventional fault detection systems can rely on a layer of material to melt when a fault occurs in order to detect the triggering event. These layers of materials can require various additional components, such as a thin trace element, in order to reduce the time it takes the layer of material to melt. This, in turn, increases the overall cost of the fault detection system and adds a layer of complexity to the manufacturing of the fault detection system. The fault detection system as described herein, however, is configured to detect the triggering event through use of a deformable material layer and a sense layer without the need for a thin trace element. As such, the complexity of the fault detection system is reduced when compared to the conventional fault detection systems.

Other benefits of the present disclosure include a broader coverage of triggering events within the PDU. For example, the deformable material layer(s), and therefore the sense layer, as described herein can be configured to be responsive to multiple triggering events that can occur within the PDU. Conventional fault detection systems can be configured to be responsive to only one triggering event. The fault detection system as described herein ensures that only one fault detection system is needed to monitor one or more triggering events.

Aspects of the present disclosure provide for the detection of electrical faults or arcing events in a power distribution assembly. The technical effect is that the above-described aspects enable the detecting or confirming of electrical faults in a circuit, and providing indication or remediation of such faults. One advantage is that the above described aspects provide for active detection of arcing electrical faults, and power can be selectively supplied or not supplied to a power distribution unit based on determination of an arcing event. As arc faults can produce large amounts of heat in a short amount of time, fast detection or remediation of such faults can increase the longevity of components within the power distribution assembly.

It is further contemplated that aspects of the present disclosure provide the ability to detect internal arc faults before they can propagate and affect other electrical systems, including other aircraft systems in an exemplary aircraft environment. Provision of a failure signal to an upstream unit or component (e.g. the detection circuit) can allow for the affected unit (e.g. the PDU) to be electrically isolated and halt the electrical failure progression. In environments utilizing high power or high voltage systems, such electrical isolation can provide for increased safety in operation.

To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and also to enable any person skilled in the art to practice aspects of the disclosure herein, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

Further aspects of the invention are provided by the subject matter of the following clauses:

A power distribution assembly, comprising a chassis having at least one wall, a deformable material layer positioned on the at least one wall of the chassis, the deformable material layer configured to deform in response to a triggering event, and a conductive sense layer positioned on the deformable material layer, opposite the at least one wall of the chassis, wherein the sense layer breaks conductivity in response to the deformation of the deformable material layer.

The power distribution assembly of any preceding clause wherein the deformation comprises a volumetric deformation of the deformable material layer.

The power distribution assembly of any preceding clause wherein the volumetric deformation is in a direction parallel with the at least one wall of the chassis.

The power distribution assembly of any preceding clause wherein the volumetric deformation is in a direction away from the at least one wall of the chassis.

The power distribution assembly of any preceding clause wherein the deformation of the deformable material layer occurs in response to a threshold amount of heat.

The power distribution assembly of any preceding clause wherein the triggering event is an arcing event created by a printed circuit board.

The power distribution assembly of any preceding clause wherein the deformable material layer comprises a first deformable material layer and a second deformable material layer, the first deformable material layer coupled to at least a portion of the chassis wherein the sense layer is positioned between and coupled to both the first deformable material layer and the second deformable material layer.

The power distribution assembly of any preceding clause wherein the sense layer is responsive to either of a deformation of the first deformable material layer or the second deformable material layer.

The power distribution assembly of any preceding clause wherein the deformation of the first deformable material layer is in reaction to a heat created by a printed circuit board, while the deformation of the second deformable material layer is in reaction to a current created by the printed circuit board The power distribution assembly of any preceding clause wherein the sense layer has a first thermal expansion coefficient, the first deformable material layer has a second thermal expansion coefficient, and the second deformable material layer has a third thermal expansion coefficient.

The power distribution assembly of any preceding clause wherein the first thermal expansion coefficient, the second thermal expansion coefficient, and the third thermal expansion coefficient are not equal.

The power distribution assembly of any preceding clause wherein a potting material is positioned between the sense layer and a printed circuit board.

The power distribution assembly of any preceding clause wherein the sense layer includes at least one breakpoint.

The power distribution assembly of any preceding clause wherein the at least one breakpoint is configured to create a discontinuity in the sense layer once a threshold deformation of the deformable material layer has occurred.

A power distribution assembly, comprising a printed circuit board, a chassis enclosing the printed circuit board, the chasing having at least one wall, a deformable material layer positioned on the at least one wall of the chassis, the deformable material layer configured to deform in response to a triggering event, a conductive sense layer positioned on the deformable material layer, opposite the at least one wall of the chassis, wherein the sense layer breaks conductivity in response to the deformation of the deformable material layer, and a fault detection circuit configured to detect when the sense layer breaks conductivity in response to the deformation of the deformable material layer.

The power distribution assembly of any preceding clause wherein the deformation is a volumetric deformation of the deformable material layer.

A method of detecting an electrical fault at a printed circuit board in a chassis, the method, comprising monitoring, by a fault detection circuit, a conductive state of a sense layer overlying a deformable material layer, the deformable material layer further overlying at least a portion of at least one wall of the chassis, and whereby the deformable material layer is configured to deform in response to an electrical fault, and in response to a change in the conductive state of the sense layer, controllably operating the printed circuit board, by the fault detection circuit.

The method of any preceding clause wherein the deformable material layer is configured to deform in response to heat created by the printed circuit board.

The method of any preceding clause wherein controllably operating the printed circuit board includes disabling the printed circuit board.

The method of any preceding clause wherein the deformable material layer is configured to deform in response to a triggering event.

What is claimed is:

1. A power distribution assembly, comprising:
   a chassis having at least one wall;
   a deformable material layer positioned on the at least one wall of the chassis, the deformable material layer configured to deform in response to a triggering event; and
   a conductive sense layer positioned on the deformable material layer, opposite the at least one wall of the chassis, wherein the conductive sense layer breaks conductivity in response to the deformation of the deformable material layer;
   wherein the triggering event creates at least an amount of current exceeding a threshold current value to the conductive sense layer and wherein the deformable material is configured to deform in response to at least the amount of current.

2. The power distribution assembly of claim 1 wherein the deformation comprises a volumetric deformation of the deformable material layer.

3. The power distribution assembly of claim 2 wherein the volumetric deformation is in a direction parallel with the at least one wall of the chassis.

4. The power distribution assembly of claim 2 wherein the volumetric deformation is in a direction away from the at least one wall of the chassis.

5. The power distribution assembly of claim 1 wherein the deformation of the deformable material layer occurs in response to a threshold amount of heat.

6. The power distribution assembly of claim 1 wherein the triggering event is an arcing event created by a printed circuit board.

7. The power distribution assembly of claim 1 wherein a potting material is positioned between the conductive sense layer and a printed circuit board.

8. The power distribution assembly of claim 1 wherein the conductive sense layer includes at least one breakpoint.

9. The power distribution assembly of claim 8 wherein the at least one breakpoint is configured to create a discontinuity in the conductive sense layer once a threshold deformation of the deformable material layer has occurred.

10. A power distribution assembly, comprising:
a chassis having at least one wall;
a deformable material layer positioned on the at least one wall of the chassis, the deformable material layer configured to deform in response to a triggering event; and
a conductive sense layer positioned on the deformable material layer, opposite the at least one wall of the chassis, wherein the conductive sense layer breaks conductivity in response to the deformation of the deformable material layer;
wherein the deformable material layer comprises a first deformable material layer and a second deformable material layer, the first deformable material layer coupled to at least a portion of the chassis wherein the conductive sense layer is positioned between and coupled to both the first deformable material layer and the second deformable material layer.

11. The power distribution assembly of claim 10 wherein the conductive sense layer is responsive to either of a deformation of the first deformable material layer or the second deformable material layer.

12. The power distribution assembly of claim 11 wherein the deformation of the first deformable material layer is in reaction to a heat created by a printed circuit board, while the deformation of the second deformable material layer is in reaction to a current created by the printed circuit board.

13. The power distribution assembly of claim 10 wherein the conductive sense layer has a first thermal expansion coefficient, the first deformable material layer has a second thermal expansion coefficient, and the second deformable material layer has a third thermal expansion coefficient.

14. The power distribution assembly of claim 13 wherein the first thermal expansion coefficient, the second thermal expansion coefficient, and the third thermal expansion coefficient are not equal.

15. A power distribution assembly, comprising:
a printed circuit board;
a chassis enclosing the printed circuit board, the chasing having at least one wall;
a deformable material layer positioned on the at least one wall of the chassis, the deformable material layer configured to deform in response to a triggering event;
a conductive sense layer positioned on the deformable material layer, opposite the at least one wall of the chassis, wherein the conductive sense layer breaks conductivity in response to the deformation of the deformable material layer; and
a fault detection circuit configured to detect when the conductive sense layer breaks conductivity in response to the deformation of the deformable material layer.

16. The power distribution assembly of claim 15 wherein the deformation is a volumetric deformation of the deformable material layer.

17. A method of detecting an electrical fault at a printed circuit board in a chassis, the method, comprising:
monitoring, by a fault detection circuit, a conductive state of a sense layer overlying a deformable material layer, the deformable material layer further overlying at least a portion of at least one wall of the chassis, and whereby the deformable material layer is configured to deform in response to an electrical fault; and
in response to a change in the conductive state of the sense layer, controllably operating the printed circuit board, by the fault detection circuit.

18. The method of claim 17 wherein the deformable material layer is configured to deform in response to heat created by the printed circuit board.

19. The method of claim 17 wherein controllably operating the printed circuit board includes disabling the printed circuit board.

20. The method of claim 17 wherein the deformable material layer is configured to deform in response to a triggering event.

* * * * *